(12) United States Patent
Eki et al.

(10) Patent No.: US 8,319,947 B2
(45) Date of Patent: Nov. 27, 2012

(54) OPERATING VALVE, EXPOSURE APPARATUS, AND DEVICE MANUFACTURING METHOD

(75) Inventors: Hiroyuki Eki, Tokyo (JP); Shiro Sakai, Saitama (JP)

(73) Assignee: Canon Kabushiki Kaisha (JP)

( * ) Notice: Subject to any disclaimer, the term of this patent is extended or adjusted under 35 U.S.C. 154(b) by 551 days.

(21) Appl. No.: 12/574,333

(22) Filed: Oct. 6, 2009

(65) Prior Publication Data

US 2010/0091261 A1    Apr. 15, 2010

(30) Foreign Application Priority Data

Oct. 10, 2008   (JP) ................. 2008-263330

(51) Int. Cl.
| | |
|---|---|
| B23B 31/30 | (2006.01) |
| B65G 1/133 | (2006.01) |
| F16K 1/00 | (2006.01) |
| G03B 27/58 | (2006.01) |
| G03B 27/60 | (2006.01) |
| G03B 27/62 | (2006.01) |

(52) U.S. Cl. ............ 355/73; 251/321; 279/3; 355/72; 355/75; 355/76; 414/752.1; 414/941

(58) Field of Classification Search .......... 251/320–321; 279/3; 355/53, 72–73, 75–77; 414/752.1, 414/937, 941; 901/40
See application file for complete search history.

(56) References Cited

U.S. PATENT DOCUMENTS
2007/0002303 A1 * 1/2007 Van De Moosdijk et al. .. 355/72

FOREIGN PATENT DOCUMENTS
| JP | 6-262464 A | 9/1994 |
|---|---|---|
| JP | 2002-343852 A | 11/2002 |

* cited by examiner

*Primary Examiner* — Hung Herny Nguyen
*Assistant Examiner* — Colin Kreutzer
(74) *Attorney, Agent, or Firm* — Rossi, Kimms & McDowell LLP

(57) ABSTRACT

An operating valve of the present invention is a differential pressure operating valve 100 for performing a vacuum suction of a substrate, the operating valve comprises a body 4 having an opening which is provided at an exhaust side for exhausting an air from an inside to an outside and is opposed to a suction side for sucking the air from the outside to the inside, a valve 8, and a spring 9 whose one end is connected with one of the suction side and the exhaust side of the body 4 and the other end is connected with the valve 8. The spring 9 is configured to stretch or compress in accordance with a differential pressure between the suction side and the exhaust side, and the valve 8 is provided with at least one hole.

7 Claims, 3 Drawing Sheets

OPERATING VALVE, EXPOSURE APPARATUS, AND DEVICE MANUFACTURING METHOD

BACKGROUND OF THE INVENTION

1. Field of the Invention

The present invention relates to a differential pressure operating valve which controls a vacuum suction force of an object to be sucked, an exposure apparatus which transfers a fine pattern onto a substrate such as a wafer, and a device manufacturing method.

2. Description of the Related Art

Recently, in an exposure apparatus used for manufacturing a device such as a semiconductor or a liquid crystal, a high accuracy and a high functionality are required in accordance with an improvement of the productivity for responding to the rapid increase of demand and a high integration. Therefore, the development of an exposure apparatus having a high throughput and a high transfer performance is desired.

In such an exposure apparatus, a substrate holding apparatus which holds a substrate such as a wafer includes a wafer chuck or the like which sucks the wafer by a predetermined vacuum suction force.

The wafer chuck receives a wafer from a conveying hand at a wafer supply position far from a focus position of a projection optical system included in the exposure apparatus. The wafer chuck also sucks to hold the received wafer by the vacuum suction force to move it to the focus position. After the exposure is finished, the wafer chuck moves from the focus position to a wafer recovery position. The conveying hand recovers the wafer from the wafer chuck at the wafer recovery position. The exposure apparatus repeatedly performs each of the processes.

Conventionally, there has been one line which generates a vacuum suction force to the wafer chuck of the wafer stage, and the vacuum suction force has been generated by performing an ON/OFF switching. The vacuum suction has started before the transfer so as not to cause a position displacement at the time of transferring the wafer.

Therefore, the exposure apparatus is in an air blank suction state in an interval after the vacuum suction starts before the wafer is mounted on the wafer chuck. Therefore, a problem that much time is necessary after the wafer is mounted on the wafer chuck and before a required suction pressure is achieved is generated. The similar problem is also generated in a reticle chuck on a reticle stage, a reticle conveying robot, a wafer conveying robot, or the like. Further, when a vacuum suction force immediately before the wafer is mounted on the wafer chuck is large, a problem that the wafer is distorted to be sucked is also generated.

With regard to the problem, Japanese Patent Laid-open No. 2002-343852 discloses a suction force variable mechanism which selects two suction lines using an electromagnetic valve that is a switching unit to change the vacuum suction force in two stages for optimizing the vacuum suction force of a wafer chuck.

However, in the suction force variable mechanism disclosed in Japanese Patent Laid-open No. 2002-343852, an electric system or a control method is complicated, and its configuration has to be large in size. Therefore, such a suction force variable mechanism is disposed at a pipe unit far from the wafer chuck, and it requires much time to increase the vacuum suction pressure of the chuck portion after the vacuum suction is turned on, which causes a reduction of throughput.

Japanese Patent Laid-open No. 06-262464 discloses a vacuum suction apparatus which sucks to fix a work by a pressure difference.

BRIEF SUMMARY OF THE INVENTION

The present invention provides an operating valve capable of quickly sucking a substrate (a wafer, a reticle, or the like) that is an object to be sucked, with a simple configuration. Further, the present invention provides an exposure apparatus and a device manufacturing method in which a throughput is improved.

An operating valve as one aspect of the present invention is an operating valve for performing a vacuum suction of a substrate. The operating valve comprises a body having an opening which is provided at an exhaust side for exhausting an air from an inside to an outside and is opposed to a suction side for sucking the air from the outside to the inside, a valve member, and an elastic member whose one end is connected with one of the suction side and the exhaust side of the body and the other end is connected with the valve member. The elastic member is configured to stretch or compress in accordance with a differential pressure between the suction side and the exhaust side. The valve member is provided with at least one hole.

An exposure apparatus as another aspect of the present invention is an exposure apparatus which exposes a pattern of a reticle onto a wafer via a projection optical system. The exposure apparatus comprises a reticle stage having a reticle chuck configured to hold the reticle, a wafer stage having a wafer chuck configured to hold the wafer, a reticle conveying robot configured to convey the reticle to the reticle stage, and a wafer conveying robot configured to convey the wafer to the wafer stage. At least one of the reticle chuck, the wafer chuck, the reticle conveying robot, and the wafer conveying robot includes the operating valve described above.

A device manufacturing method as another aspect of the present invention comprises the steps of exposing a wafer using the exposure apparatus described above, and developing the exposed wafer.

Further features and aspects of the present invention will become apparent from the following description of exemplary embodiments with reference to the attached drawings.

DETAILED DESCRIPTION OF THE PREFERRED EMBODIMENTS

Figure 1:
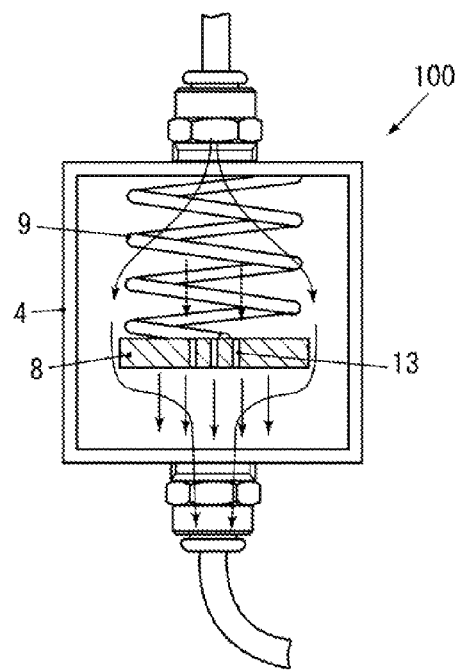
FIG. 1 is a cross-sectional view showing a schematic configuration of a differential pressure operating valve in Embodiment 1.

Exemplary embodiments of the present invention will be described below with reference to the accompanied drawings.

In each of the drawings, the same elements will be denoted by the same reference numerals and the duplicate descriptions thereof will be omitted.

Figure 6:
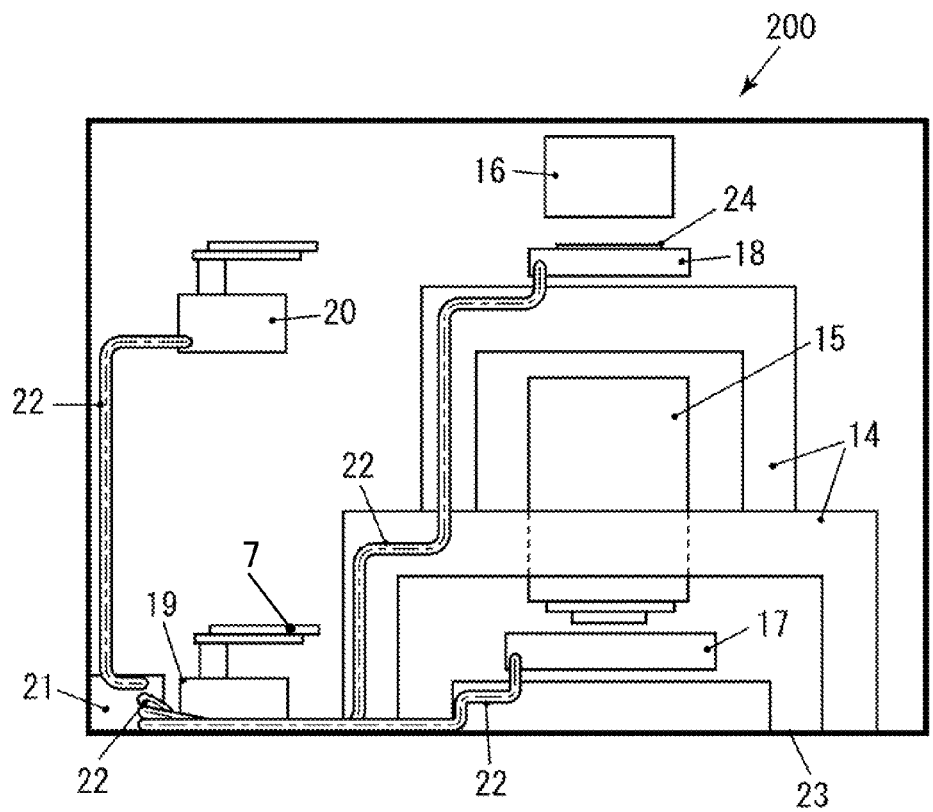
FIG. 6 is a schematic configuration view of an exposure apparatus in the present embodiment.

First, a schematic configuration of an exposure apparatus to which a differential pressure operating valve (operating valve) of the present embodiment will be described. FIG. 6 is a schematic configuration view of an exposure apparatus 200 in the present embodiment.

The exposure apparatus 200 is an exposure apparatus which exposes a substrate used for a semiconductor or a liquid crystal. Each component of the exposure apparatus 200 is provided inside a chamber 23. An illumination system 16 includes a light source and an illumination optical system. The illumination optical system illuminates a pattern of a reticle 24 disposed on a reticle stage 18 using light from the light source.

The light emitted from the reticle 24 illuminates a wafer (not shown) which is disposed on a wafer stage 17 via a projection lens 15 (projection optical system) arranged inside a structure 14. Thus, the projection optical system projects a pattern of a reticle 24 onto a wafer 7 (substrate).

The differential pressure operating valve of the present embodiment includes a mechanism that sucks an object to be sucked such as a substrate. Such a differential pressure operating valve is, for example used for a reticle stage 18 or a wafer stage 17 in the exposure apparatus 200. The differential pressure operating valve of the present embodiment may also be, for example used for a reticle conveying robot 20 or a wafer conveying robot 19 which conveys a reticle 24 or a wafer 7 with respect to the reticle stage 18 or the wafer stage 17.

A pipe unit 21 is configured as a unit which supplies a vacuum force (vacuum suction force) for each object to be sucked. The pipe unit 21 is connected with each differential pressure operating valve via a pipe 22. The pipe unit 21 divides a vacuum suction force supplied from a factory to make each of the divided vacuum suction forces stable to perform an ON/OFF switching.

As described later, for example, the wafer stage 17 is provided with a wafer chuck for sucking the wafer 7. The reticle stage 18 is provided with a reticle chuck for sucking the reticle 24. The differential pressure operating valve controls the vacuum suction force on a suction surface of the chuck.

[Embodiment 1]

Next, a configuration of a differential pressure operating valve in Embodiment 1 of the present invention will be described. FIG. 1 is a cross-sectional view showing a schematic configuration of a differential pressure operating valve 100 in the present embodiment.

The differential pressure operating valve 100 is configured so as to control a vacuum suction force of an object to be sucked. The differential pressure operating valve 100 includes a body 4, a valve 8 (valve member), and a spring 9 (elastic member). The body 4 has an opening which is provided at an exhaust side for exhausting an air from an inside to an outside of the body and is opposed to a suction side for sucking the air from the outside to the inside of the body. The valve 8 and the spring 9 are provided inside the body 4. One end of the spring 9 is connected with the suction side of the body 4 and the other end is connected with the valve 8. The spring 9 has a predetermined spring constant and supports the valve 8 so as not to contact on a lower surface of the body 4.

A vacuum suction of air inside the differential pressure operating valve 100 is performed by the pipe unit 21. FIG. 1 shows a state of the differential pressure operating valve 100 at the start of performing the vacuum suction, and arrows in FIG. 1 represent directions of flows of the air at this time. On the lower side of the differential pressure operating valve 100 shown in FIG. 1, for example the pipe unit 21 is connected. Therefore, the air inside the differential pressure operating valve 100 is sucked from an upward to downward direction.

When the vacuum suction starts to be performed, a predetermined pressure difference is generated for an internal atmosphere of the differential pressure operating valve 100. The internal atmosphere of the differential pressure operating valve 100 has a low pressure in a downward direction. Therefore, the spring 9 starts to stretch in the downward direction where the internal atmosphere has a low pressure, and the valve 8 supported by the spring 9 starts to move in the downward direction.

A hole 13 is formed in the valve 8. In the present embodiment, a plurality of holes 13 are formed in the valve 8, but the present invention is not limited to this and at least one hole 13 has only to be formed. When the valve 8 finally contacts (sucks) the lower surface of the body 4, the vacuum suction of a small amount of air in the body 4 of the differential pressure operating valve 100 is performed only through the hole 13 formed in the valve 8. In other words, when the spring 9 has stretched, the vacuum suction is performed through both of the hole 13 and the opening.

A state of the differential pressure operating valve 100 in this case is called a "valve closed state". In the valve closed state, the spring 9 is stretched to contact the valve 8 on one surface (lower surface) of the body 4 so that the valve 8 prevents the flow of the air inside the body 4, and the air is sucked only through the hole 13 to reduce the vacuum suction force.

When the vacuum suction stops, the internal atmosphere of the differential pressure operating valve 100 has a constant pressure without a differential pressure. Therefore, a force to stretch the spring 9 is lost. Therefore, the spring 9 quickly returns in the upward direction to be in an initial state. At the same time, the valve 8 supported by the spring 9 also quickly returns in the upward direction. The state of the differential pressure operating valve 100 in this case is called a "valve opened state".

In the present embodiment, an amount of closing a valve (a vacuum suction amount in the valve closed state) or a moving timing between the valve closed state and the valve opened state is determined by conditions such as a spring constant of the spring 9, a movable amount of the valve 8, a pressure difference between an original pressure of the vacuum suction and the atmosphere where the vacuum suction is performed, the number of the hole 13, or a diameter of the hole 13. Therefore, in accordance with the purpose or the specification, it is preferable that each of these conditions is appropriately selected.

Figure 2:
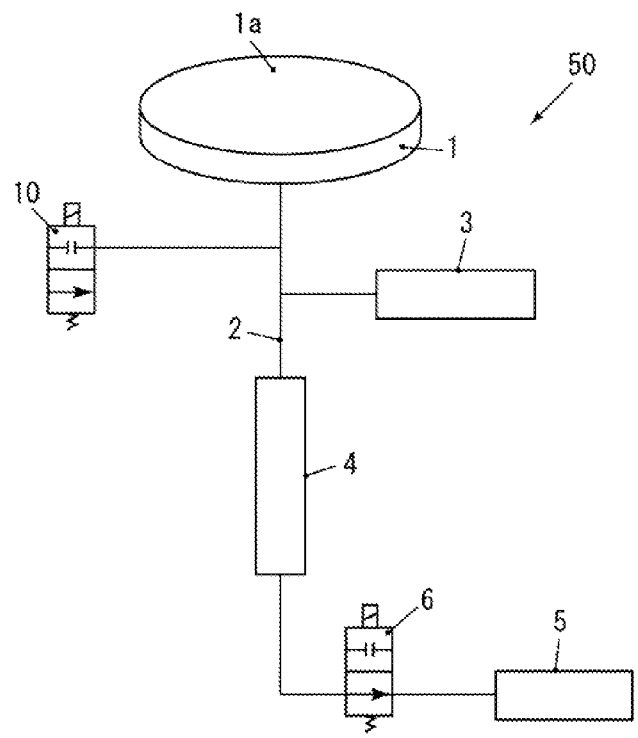
FIG. 2 is a cross-sectional view of a substrate holding apparatus in Embodiment 1.

Next, a substrate holding apparatus as one example to which the differential pressure operating valve 100 of the present embodiment is applied will be described. FIG. 2 is a schematic configuration view of a substrate holding apparatus 50 in the present embodiment.

The substrate holding apparatus 50 of the present embodiment is provided at a wafer stage which sucks a wafer. However, the differential pressure operating valve 100 of the present embodiment is not limited to be applied to the wafer stage, and it is applicable to any object to which a vacuum line relates.

The substrate holding apparatus 50 shown in FIG. 2 is, for example provided at the wafer stage 17 (XY stage) in the exposure apparatus 200 of FIG. 6.

A wafer chuck 1 (wafer holding plate) for sucking to hold the wafer is mounted on the wafer stage 17. The wafer chuck 1 has a suction surface 1a as a holding surface of the wafer.

A VAC source 5 (vacuum source) generates a vacuum suction force for sucking the wafer as a substrate on the suction surface 1a of the wafer chuck 1. The VAC source 5 is, for example constituted by a vacuum pump.

The pipe 2 transfers the vacuum suction force generated by the VAC source 5 to the suction surface 1a. A switching valve 6 performs a switching for controlling whether or not the vacuum suction force generated by the VAC source 5 is transferred to the suction surface 1a of the wafer chuck 1. A switching valve 10 performs a switching for stopping the vacuum suction. A pressure sensor 3 is configured to detect a pressure inside the pipe 2.

In the substrate holding apparatus 50 of the present embodiment, the differential pressure operating valve 100 is provided between the wafer chuck 1 and the VAC source 5. The pressure sensor 3 detects a pressure inside the pipe 2 between the wafer chuck 1 and the differential pressure operating valve 100.

Figures 3A, 3B, 3C:
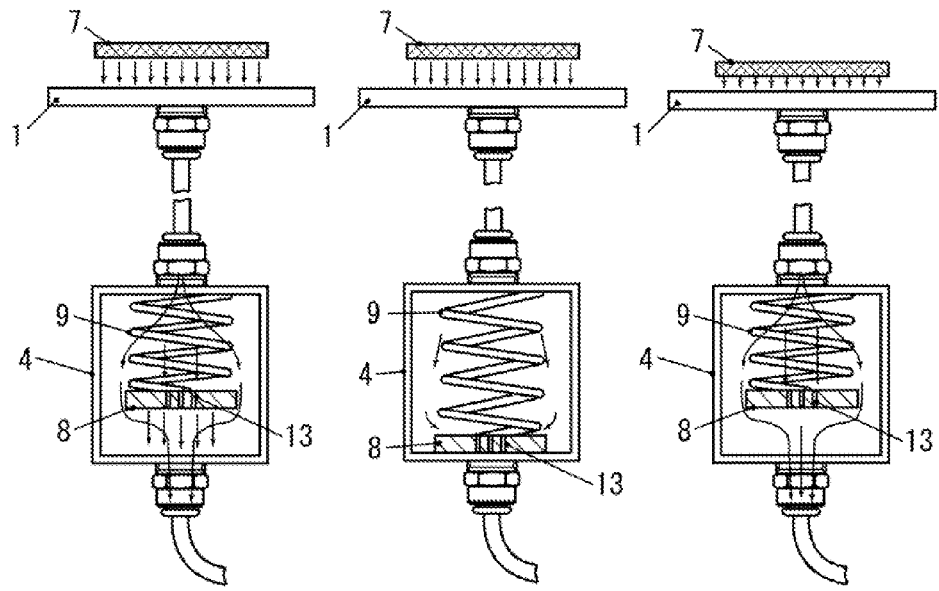
FIGS. 3A to 3C are schematic views showing, in time series, an operation of a differential pressure operating valve in Embodiment 1.

Next, the operation of the differential pressure operating valve 100 in the present embodiment will be described. FIGS. 3A to 3C are schematic views showing, in time series, the operation of the differential pressure operating valve 100 in the present embodiment. FIG. 3A shows a state where a vacuum suction of the differential pressure operating valve 100 starts to be performed, FIG. 3B shows a state where the valve 8 contacts on the lower surface of the body 4, and FIG. 3C shows a state where the spring 9 is returning to the initial position.

When the wafer 7 conveyed by a wafer conveying apparatus (not shown) comes close to the suction surface of the wafer chuck 1, the vacuum suction starts in accordance with switching of the switching valve 6. In this case, the differential pressure operating valve 100 shows a vacuum suction starting state shown in FIG. 3A.

In the vacuum suction starting state, there is a comparatively large gap between the wafer 7 and the wafer chuck 1. In this case, the VAC source 5 performs a blank suction of air, and the differential pressure between a pressure inside the differential pressure operating valve 100 and the original pressure of the VAC source 5 is large. Therefore, the spring 9 of the differential pressure operating valve 100 stretches in the downward direction by the differential pressure to move the valve 8 in the downward direction.

When the valve 8 moves up to contacting the lower surface of the body 4 to be sucked on the lower surface, a vacuum suction of a small amount of air is performed only through both of the hole 13 provided in the valve 8 and the opening provided on the lower surface of the body 4 and connected with the VAC source 5. At this time, the differential pressure operating valve 100 is in the valve closed state shown in FIG. 3B (a state where the vacuum suction amount is restricted).

When the wafer 7 comes closer to the wafer chuck 1 by a wafer conveying apparatus (not shown), the gap between the wafer 7 and the wafer chuck 1 is reduced. Therefore, the vacuum suction amount decreases and the differential pressure between the internal atmosphere of the differential pressure operating valve 100 and the original pressure of the VAC source 5 is reduced.

When the differential pressure is reduced up to equal to or less than a predetermined value which is determined by a spring constant of the spring 9 or the like in a state where the wafer 7 is close to the wafer chuck 1, the spring 9 is compressed in an upward direction to start to move the valve 8 in the upward direction. At this time, the differential pressure operating valve 100 is in the valve opened state shown in FIG. 3C. In the valve opened state, the vacuum suction force increases because the valve 8 is away from the lower surface of the body 4.

Thus, the spring 9 stretches and compresses in accordance with the differential pressure between a first-order side and a second-order side in the body 4. When the vacuum suction starts via the opening of the body 4 in a state where the vacuum suction of the wafer 7 is not performed and the differential pressure is greater than a predetermined value, the spring 9 stretches (stretches or compresses) so that the valve 8 comes close to the first-order side of the body 4, and the vacuum suction force decreases. On the other hand, when the differential pressure is equal to or less than the predetermined value in a state where the wafer 7 is closing to the wafer chuck 1, the spring 9 compresses (stretches or compresses) so that the valve 8 comes close to the second-order side of the body 4, and the vacuum suction force increases.

The first-order side in the body 4 means an exhaust side (pump side) where the air is exhausted from an inside of the body 4 to the VAC source 5 (pump), and the second-order side means a suction side where the air is sucked into the inside of the body 4. The predetermined value is preferably a value as small as possible, by which it is able to be determined that the wafer has been mounted on the wafer chuck.

Because the vacuum suction force increases in the valve opened state, the wafer 7 (object to be sucked) can be quickly and strongly sucked on the wafer chuck 1. At this time, the wafer 7 is away from the wafer conveying apparatus (not shown), and the wafer 7 is completely mounted on the wafer chuck 1. In this case, the pressure sensor 3 monitors the vacuum suction force to determine whether or not the wafer 7 is appropriately sucked on the wafer chuck 1 to proceed to a subsequent sequence.

When the wafer 7 is sucked on the suction surface of the wafer chuck 1, for example the wafer stage 17 of the exposure apparatus 200 starts to perform a drive, and for exposure, it moves from a wafer supply position to a focus position.

When the wafer stage 17 completes to move to a wafer recovery position after the exposure is finished, the flow proceeds to a sequence in which the wafer conveying apparatus (not shown) releases the wafer 7 from the suction surface of the wafer chuck 1. At this time, the switching valve 6 shown in FIG. 2 is closed. At the same time, the switching valve 10 is opened, and the vacuum state in the pipe 2 between the wafer chuck 1 and the differential pressure operating valve 100 is canceled. In this case, the pressure sensor 3 monitors the vacuum suction force to confirm that the wafer 7 is not sucked on the wafer chuck 1. Subsequently, the wafer 7 is conveyed by the wafer conveying apparatus (not shown).

Figure 4:
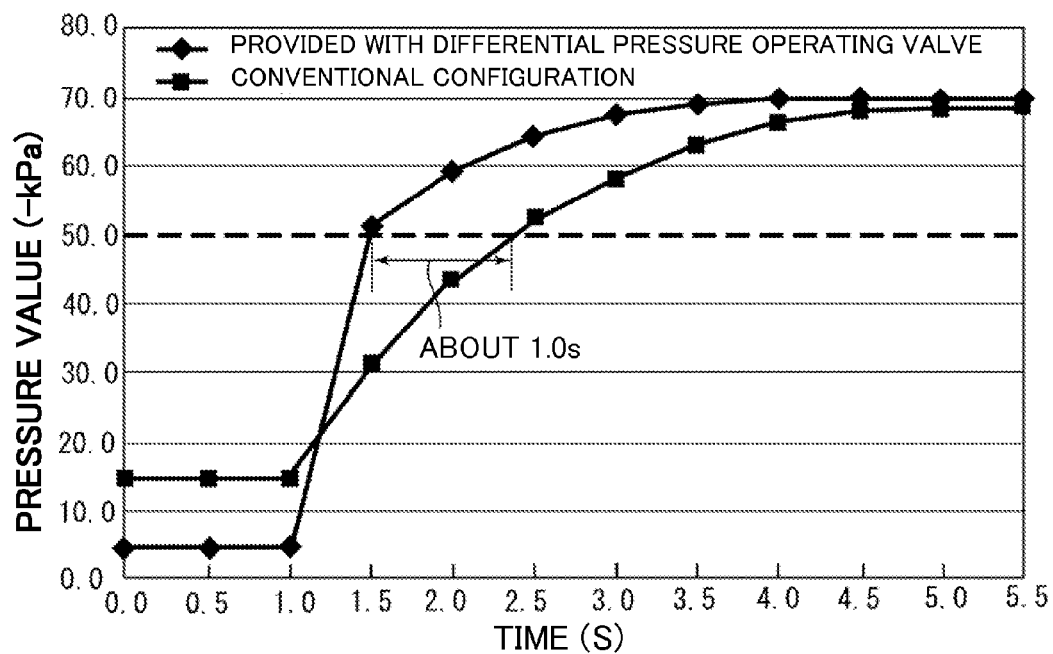
FIG. 4 is a graph for explaining an effect of a case where a differential pressure operating valve in Embodiment 1 is applied to a wafer chuck.

Next, an effect of the case where the differential pressure operating valve of the present embodiment is applied will be described. FIG. 4 is a graph for explaining the effect of the case where the differential pressure opening valve 100 of the present embodiment is applied to the wafer chuck 1. A change with a passage of time of a pressure value which is detected by the pressure sensor 3 is shown in FIG. 4 for each of a wafer chuck to which the differential pressure operating valve 100 is applied and a conventional wafer chuck (a case where the differential pressure opening valve 100 is not applied).

FIG. 4 shows a pressure value of the pressure sensor 3 and a passage of time, where a time of starting the vacuum suction by a switching of the switching valve 6 after the wafer 7 is conveyed on the wafer chuck 1 by the wafer conveying apparatus is defined as 0 s (zero second). A time interval between the start of performing the vacuum suction and the passage of time 1 s shows a state where the wafer 7 is still not mounted on the wafer chuck 1 (air blank suction state: FIG. 3B).

When the pressure value of the VAC source 5 is for example set to −70 kPa, the pressure value of the pressure sensor 3 shows around −15 kPa if the differential pressure operating valve 100 is not provided, and shows around −5 kPa if the differential pressure operating valve 100 is provided. The pressure value obtained by not providing the differential pressure operating valve 100 is a pressure value obtained by directly exposing the VAC source 5 in the air. In this case, because the differential pressure with respect to the pressure in the air is large, the VAC source 5 causes a reduction of pressure.

On the other hand, the pressure value obtained by providing the differential pressure operating valve 100 is a value in a state where a valve is formed between the VAC source 5 and the wafer chuck 1. Because the differential pressure is limited by the valve state, the reduction of pressure is avoided.

As shown in FIG. 4, after time is at which the wafer 7 is mounted on the wafer chuck 1, the pressure value obtained by providing the differential pressure operating valve 100 rapidly increases while the pressure value obtained by not providing the differential pressure operating valve 100 moderately increases. This is because the original pressure of the VAC source 5 does not decrease if the differential pressure operating valve 100 is provided.

In comparing time intervals required for achieving a pressure threshold value which permits to proceed to a subsequent sequence, for example −50 kPa, a time interval difference around 1 s observed between cases where the differential pressure operating valve 100 is provided (configuration of the present embodiment) and is not provided (conventional configuration). In other words, the configuration where the differential pressure operating valve 100 is provided can achieve the pressure threshold value in a short time as compared with the conventional configuration.

Since the differential pressure operating valve 100 in the present embodiment has a low initial pressure by which the wafer 7 is transferred to the wafer chuck 1, it also has an effect that reduces deflection. When the wafer 7 is conveyed on the suction surface of the wafer chuck 1 to start the vacuum suction, a state shown in FIG. 3A is observed. Subsequently, the state moves to the valve closed state shown in FIG. 3B. The vacuum suction is performed in the valve closed state to be able to reduce the deflection of the wafer 7.

As described above, according to the present embodiment, in the air blank suction state before a substrate such as a wafer is mounted on a wafer chuck or the like, the reduction of an original pressure of a vacuum line (VAC source) can be suppressed. When the substrate such as a wafer is mounted on the wafer chuck or the like, the vacuum pressure on the suction surface of the wafer chuck rapidly increases up to a pressure value by which the completion of the suction is confirmed because the reduction of the original pressure of the vacuum line is suppressed. Therefore, the throughput can be improved.

The differential pressure operating valve of the present embodiment does not have a complicated configuration where an electromagnetic valve such as a flow rate switching mechanism or the like is combined. The differential pressure operating valve of the present embodiment is mechanically configured to be small and simple, and has a structure where a power cable or a communication cable is not necessary. Therefore, it can be installed without being limited by its application area. Accordingly, the differential pressure operating valve of the present embodiment can be configured near the wafer chuck, and a pipe length between a suction portion and the differential pressure operating valve can be shortened. As a result, the time interval required for completing the suction can also be further shortened.

[Embodiment 2]

Figure 5:
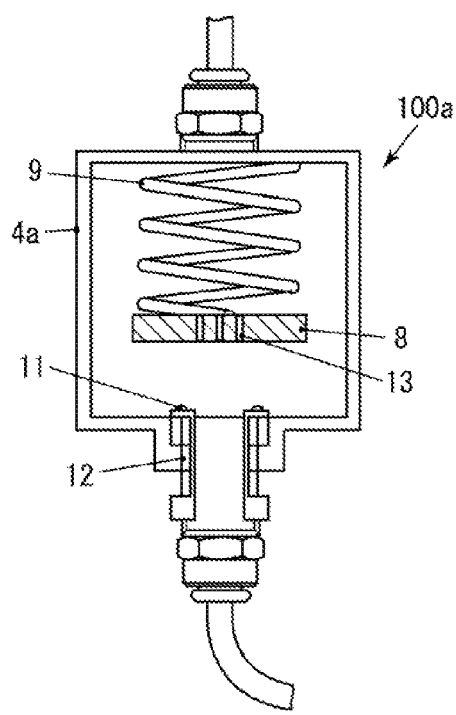
FIG. 5 is a cross-sectional view showing a schematic configuration of a differential pressure operating valve in Embodiment 2.

Next, a configuration of a differential pressure operating valve in Embodiment 2 of the present invention will be described. FIG. 5 is a cross-sectional view showing a schematic configuration of a differential pressure operating valve 100a in the present embodiment.

The differential pressure operating valve 100a of the present embodiment is provided with a valve adjusting mechanism in addition to the components provided in the differential pressure operating valve 100 of Embodiment 1. The valve adjusting mechanism of the differential pressure operating valve 100a adjusts a movable range of the valve 8 inside the body 4a, and has a contact portion 11 and a screw portion 12. The contact portion 11 is constituted of an O-ring or the like. The screw portion 12 is configured to be able to move the contact portion 11 in an upward and downward direction.

Such a valve adjusting mechanism is able to limit a movable range of the valve 8 in the differential pressure operating valve 100a. The differential pressure operating valve of the present embodiment is provided with the valve adjusting mechanism to be able to adjust a start timing of the operation of the valve 8 and also to easily adjust a pressure value of the VAC source if the pressure value varies.

Therefore, the differential pressure operating valve 100a of the present embodiment adjusts the movable range 8 using the valve adjusting mechanism to be able to set the differential pressure value required for reducing the vacuum suction force to a variable value.

As described above, according to each of the above embodiments, the vacuum suction amount can be mechanically restricted (the valve is closed) in the air blank suction state where the object to be sucked such as a wafer is comparatively far from the suction surface, and the valve can be mechanically opened when the object to be sucked comes close to the suction surface. Thus, the load of the original pressure of the VAC source can be suppressed and the object to be sucked can be accurately stably sucked.

The differential pressure operating valve of each of the above embodiments can mechanically control an amount of vacuum supply, and it has a small and simple configuration. Further, a power cable or a communication cable is not necessary. Therefore, the differential pressure operating valve can be installed without limiting a location. For example, the differential pressure operating valve of each of the above embodiments can be provided near the wafer chuck. Accordingly, the time interval after the wafer is mounted on the wafer chuck before the suction of the wafer is completed can be significantly shortened. Further, because a vacuum state can be rapidly opened at the time of recovering the wafer, the throughput of an exposure apparatus can be significantly improved.

A device (a semiconductor integrated circuit device, a liquid crystal display device, or the like) is manufactured by performing a process of exposing a substrate (a wafer, a glass plate, or the like) to which a photosensitizing agent is applied using an exposure apparatus in any one of the above embodiments, a process of developing the substrate, and other well-known processes.

According to each of the above embodiments, a differential pressure operating valve capable of rapidly and stably sucking an object to be sucked can be provided. Further, according to each of the above embodiments, an exposure apparatus and a device manufacturing method in which a throughput is improved can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

For example, in each of the above embodiments, the differential pressure operating valve applicable to the exposure apparatus has been specifically described, but the present invention is not limited to this. The differential pressure operating valve in each of the above embodiments is also applicable to an apparatus other than the exposure apparatus. Further, in each of the above embodiments, one end of the spring is connected with a suction side of a body, but the present invention is not limited to this, and the one end may also be configured to be connected with an exhaust side of the body.

This application claims the benefit of Japanese Patent Application No. 2008-263330, filed on Oct. 10, 2008, which is hereby incorporated by reference herein in its entirety.

What is claimed is:

1. An operating valve for performing a vacuum suction of a substrate, the operating valve comprising:
    a body having an opening which is provided at an exhaust side for exhausting an air from an inside to an outside and is opposed to a suction side for sucking the air from the outside to the inside;
    a valve member; and
    an elastic member whose one end is connected with one of the suction side and the exhaust side of the body and the other end is connected with the valve member,
    wherein the elastic member is configured to stretch or compress in accordance with a differential pressure between the suction side and the exhaust side, and
    wherein the valve member is provided with at least one hole arranged at a position opposed to the opening.

2. An operating valve according to claim 1, wherein the elastic member stretches or compresses so that the valve member comes close to the exhaust side of the body and the vacuum suction force is reduced when the vacuum suction starts via the opening of the body and the differential pressure is greater than a predetermined value in a state where the vacuum suction of the substrate is not performed.

3. An operating valve according to claim 2, wherein the elastic member stretches or compresses so that the valve member comes close to the suction side of the body and the vacuum suction force increases when the differential pressure is equal to or less than the predetermined value in a state where the substrate is closed.

4. An operating valve according to claim 2, further comprising an adjusting unit configured to adjust a movable range of the valve member, wherein the predetermined value is set by adjusting the movable range of the valve member using the adjusting unit.

5. An operating valve according to claim 1, wherein the vacuum suction is performed through both of the at least one hole and the opening when the valve member contacts the body.

6. An exposure apparatus which exposes a pattern of a reticle onto a wafer via a projection optical system, the exposure apparatus comprising:
    a reticle stage having a reticle chuck configured to hold the reticle;
    a wafer stage having a wafer chuck configured to hold the wafer;
    a reticle conveying robot configured to convey the reticle to the reticle stage; and
    a wafer conveying robot configured to convey the wafer to the wafer stage,
    wherein at least one of the reticle chuck, the wafer chuck, the reticle conveying robot, and the wafer conveying robot includes an operating valve,
    wherein the operating valve is configured to perform a vacuum suction of at least one of the wafer and the reticle, the operating valve comprising:
        a body having an opening which is provided at an exhaust side for exhausting an air from an inside to an outside and is opposed to a suction side for sucking the air from the outside to the inside;
        a valve member; and
        an elastic member whose one end is connected with one of the suction side and the exhaust side of the body and the other end is connected with the valve member,
    wherein the elastic member is configured to stretch or compress in accordance with a differential pressure between the suction side and the exhaust side, and
    wherein the valve member is provided with at least one hole arranged at a position opposed to the opening.

7. A device manufacturing method comprising the steps of:
exposing a wafer using an exposure apparatus; and
developing the exposed wafer,
wherein the exposure apparatus is configured to expose a pattern of a reticle on the wafer via a projection optical system, the exposure apparatus comprising:
    a reticle stage having a reticle chuck configured to hold the reticle;
    a wafer stage having a wafer chuck configured to hold the wafer;
    a reticle conveying robot configured to convey the reticle to the reticle stage; and
    a wafer conveying robot configured to convey the wafer to the wafer stage,
    wherein at least one of the reticle chuck, the wafer chuck, the reticle conveying robot, and the wafer conveying robot includes an operating valve,
    wherein the operating valve is configured to perform a vacuum suction of at least one of the wafer and the reticle, the operating valve comprising:
        a body having an opening which is provided at an exhaust side for exhausting an air from an inside to an outside and is opposed to a suction side for sucking the air from the outside to the inside;
        a valve member; and
        an elastic member whose one end is connected with one of the suction side and the exhaust side of the body and the other end is connected with the valve member,
    wherein the elastic member is configured to stretch or compress in accordance with a differential pressure between the suction side and the exhaust side, and
    wherein the valve member is provided with at least one hole arranged at a position opposed to the opening.

* * * * *